United States Patent

Tao et al.

[11] Patent Number: 5,871,658
[45] Date of Patent: Feb. 16, 1999

[54] OPTICAL EMISSON SPECTROSCOPY (OES) METHOD FOR MONITORING AND CONTROLLING PLASMA ETCH PROCESS WHEN FORMING PATTERNED LAYERS

[75] Inventors: Hun-Jan Tao, Hsinchu; Chia Shiung Tsai; Chen-Hua Yu, both of Hsin-Chu, all of Taiwan

[73] Assignee: Taiwan Semiconductor Manufacturing Company, Ltd., Hsin-Chu, Taiwan

[21] Appl. No.: 782,708

[22] Filed: Jan. 13, 1997

[51] Int. Cl.[6] .................................................. H01L 21/00
[52] U.S. Cl. .................................. 216/60; 216/59; 438/9; 204/192.33
[58] Field of Search .................................... 438/714, 725, 438/7, 8, 9, 14; 216/59, 60; 204/192.33, 298.32; 118/712, 713; 156/345

[56] References Cited

U.S. PATENT DOCUMENTS

| | | | |
|---|---|---|---|
| 4,493,745 | 1/1985 | Chen et al. | 156/626 |
| 5,014,217 | 5/1991 | Savage | 364/498 |
| 5,064,269 | 11/1991 | Roger et al. | 385/115 |
| 5,322,590 | 6/1994 | Koshimizu | 156/626 |
| 5,343,412 | 8/1994 | Birang | 364/572 |
| 5,347,460 | 9/1994 | Gifford et al. | 364/468 |
| 5,395,642 | 3/1995 | Hamerich et al. | 427/8 |
| 5,467,883 | 11/1995 | Frye et al. | 216/60 |
| 5,546,322 | 8/1996 | Gifford et al. | 364/497 |
| 5,552,016 | 9/1996 | Chanayen | 156/627.1 |
| 5,683,538 | 11/1997 | O'Neill et al. | 156/345 |

*Primary Examiner*—Bruce Breneman
*Assistant Examiner*—Luz Alejandro
*Attorney, Agent, or Firm*—George O. Saile; Stephen B. Ackerman; Alek P. Szecsy

[57] ABSTRACT

A method for monitoring and controlling a plasma etch method for forming a patterned layer. There is first provided a substrate having a blanket layer formed thereover, the blanket layer having a patterned photoresist layer formed thereupon. There is then etched through a plasma etch method while employing the patterned photoresist layer as a patterned photoresist etch mask layer the blanket layer to form a patterned layer. The plasma etch method is monitored through an optical emission spectroscopy (OES) method which monitors a minimum of a first plasma etchant component which relates to a chemical etching of the blanket layer and a second plasma etchant component which relates to a physical sputter etching of the blanket layer and the patterned photoresist layer. While etching through the plasma etch method there is adjusted at least one of a first control parameter which controls the first plasma etchant component concentration and a second control parameter which controls the second plasma etchant component concentration to provide through the plasma etch method from the blanket layer a patterned layer with a pre-determined blanket layer to patterned photoresist layer plasma etch selectivity. There is also disclosed an apparatus through which the method may be practiced.

10 Claims, 5 Drawing Sheets

OPTICAL EMISSON SPECTROSCOPY (OES) METHOD FOR MONITORING AND CONTROLLING PLASMA ETCH PROCESS WHEN FORMING PATTERNED LAYERS

BACKGROUND OF THE INVENTION

1. Field of the Invention

The present invention relates generally to methods for forming patterned layers when fabricating integrated circuits. More particularly, the present invention relates to plasma etch methods for forming patterned layers when fabricating integrated circuits.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

As integrated circuit technology has advanced and integrated circuit device dimensions have decreased, it has become increasingly important within advanced integrated circuits to form patterned layers, such as but not limited to patterned dielectric layers, patterned semiconductor layers and patterned conductor layers, with controlled cross-sectional profiles. As patterned layers become particularly narrow in linewidth and/or pitch, generally less than about 0.25 microns in linewidth and/or pitch, it becomes more difficult with conventional reactive ion etch (RIE) plasma etch methods to form such patterned layers with controlled cross-sectional profiles.

To assist in forming within advanced integrated circuits patterned layers simultaneously possessing: (1) particularly narrow linewidth and/or pitch; and (2) controlled cross-sectional profiles, there has recently been introduced into integrated circuit fabrication the use of high density plasma (HDP) reactive ion etch (RIE) plasma etch methods. High density plasma (HDP) reactive ion etch (RIE) plasma etch methods are typically characterized by plasma densities of greater than about 1E11–1E13 active plasma species per cubic centimeter of plasma. While high density plasma (HDP) reactive ion etch (RIE) plasma etch methods have demonstrated utility within advanced integrated circuit fabrication by assisting in providing patterned layers of particularly narrow linewidth and/or pitch with improved cross-sectional profiles, the use of high density plasma (HDP) reactive ion etch (RIE) plasma etch methods is not entirely without problems. In particular, it has been observed that when high density plasma (HDP) reactive ion etch (RIE) plasma etch methods are employed in etching within advanced integrated circuits layers such as dielectric layers formed of silicon oxide, there is observed a comparatively low etch rate for the dielectric layers and a comparatively high etch selectivity of the high density plasma (HDP) reactive ion etch (RIE) plasma etch method for a photoresist etch mask layer employed in defining the portions of the dielectric layers to be etched. Comparatively low etch rates within high density plasma (HDP) reactive ion etch (RIE) plasma etch methods for layers such as dielectric layers are undesirable since they provide high density plasma (HDP) reactive ion etch (RIE) plasma etch methods which are particularly time consuming. Similarly, comparatively high etch selectivity ratios of high density plasma (HDP) reactive ion etch (RIE) plasma etch methods for photoresist etch mask layers with respect to blanket layers desired to be patterned are undesirable since they may ultimately compromise the improved cross-sectional profile of patterned layers formed employing high density plasma (HDP) reactive ion etch plasma etch methods.

Figure 1:
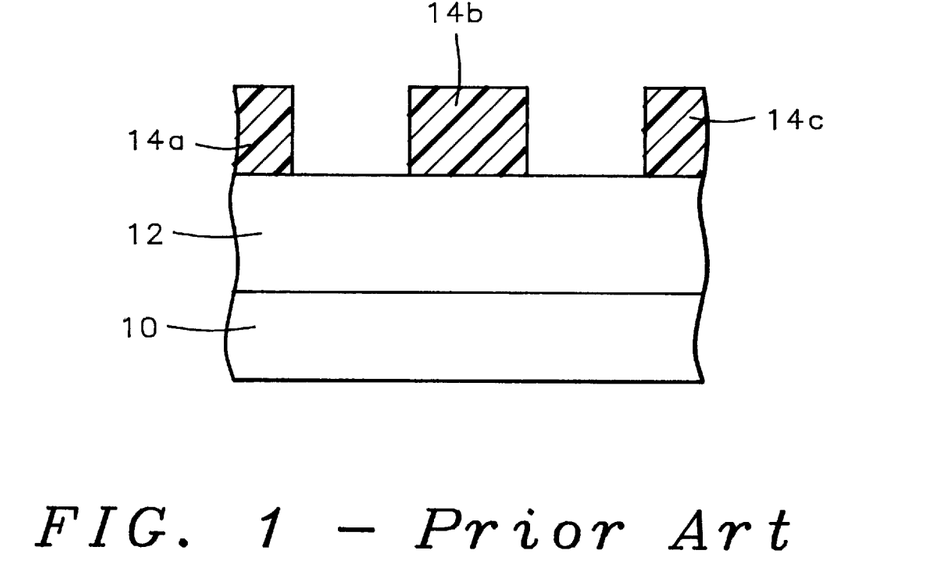
FIG. 1 and FIG. 2 show a pair of schematic cross-sectional diagrams illustrating the results of etching through a high density plasma (HDP) reactive ion etch (RIE) plasma etch method conventional in the art a blanket layer to form a series of patterned layers.
Figure 2:
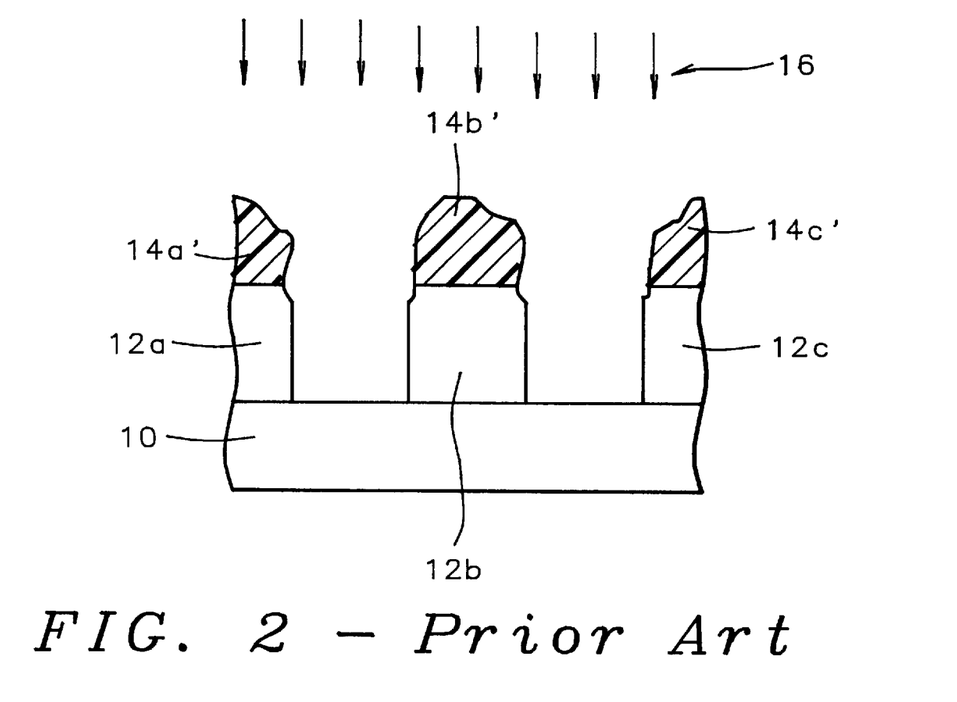

Such a compromise of cross-sectional profile of patterned layers is illustrated by the cross-sectional schematic diagrams of FIG. 1 and FIG. 2. Shown in FIG. 1 is a substrate 10 having formed thereover a blanket layer 12 which is desired to be patterned into a series of patterned layers employing a series of patterned photoresist layers 14a, 14b and 14c formed upon the blanket layer 12. Shown in FIG. 2 is a schematic cross-sectional diagram illustrating the results of further processing of the substrate 10 whose schematic cross-sectional diagram is illustrated in FIG. 1. Shown in FIG. 2 is the results of etching through a high density plasma (HDP) reactive ion etch (RIE) plasma 16 the blanket layer 12 to form the patterned layers 12a, 12b and 12c. When employing the high density plasma (HDP) reactive ion etch (RIE) plasma 16 it is common for the patterned photoresist layers 14a, 14b and 14c to be substantially etched in forming the etched patterned photoresist layers 14a', 14b' and 14c', as illustrated in FIG. 2, thus also eroding the upper edges of the patterned layers 12a, 12b and 12c.

It is thus desirable in the art of advanced integrated circuit fabrication to employ high density plasma (HDP) reactive ion etch (RIE) plasma etch methods which provide superior cross-sectional profile control when forming patterned layers within advanced integrated circuits, while simultaneously providing: (1) enhanced etch rates for those patterned layers; and (2) reduced etch selectivities of photoresist etch mask layers with respect to those patterned layers, that the present invention is generally directed.

Methods through which reactive ion etch (RIE) plasma etch methods may be monitored and/or controlled are known in the art of integrated circuit fabrication. For example, Chen et al., in U.S. Pat. No. 4,493,745 discloses an optical emission spectroscopy (OES) endpoint detection method within which is determined an inflection point at which optical emission intensity of a reactive ion etch (RIE) plasma within a plasma reactor chamber changes when etching a series of integrated circuit layers upon a series of substrates within the plasma reactor chamber. There is then continued the reactive ion etch (RIE) plasma etch reaction for a time period determined by characteristics of the reactive ion etch (RIE) plasma and the series of integrated circuit layers desired to be etched by the plasma. In addition, Savage, in U.S. Pat. No. 5,014,217 discloses an apparatus and method for automatically identifying chemical species within a plasma reactor chamber. The method employs a comparison of the optical emission spectrum (OES) of a plasma within the reactor chamber with a library of pre-defined optical emission spectra (OES) of various chemical species.

Further, Koshimizu, in U.S. Pat. No. 5,322,590 discloses a method for monitoring and controlling the endpoint when plasma etching silicon oxide layers upon semiconductor substrates. The method employs monitoring the optical emission spectrum (OES) of an active fluorocarbon species employed in etching a silicon oxide layer. Yet further, Birang, in U.S. Pat. No. 5,343,412 discloses a method and apparatus employing optical emission spectroscopy (OES) for determining endpoints of integrated circuit processes, preferably integrated circuit plasma processes, within integrated circuit process chambers. Through the method there is recorded emitted light intensity as a function of time and determined whether the emitted light intensity has a positive slope, a negative slope or a zero slope. Still yet further, Gifford et al., in U.S. Pat. No. 5,347,460 and U.S. Pat. No. 5,546,322 disclose a method and apparatus employing optical emission spectroscopy (OES) for monitoring and controlling a plasma based integrated circuit fabrication process. The method employs a computer to identify various gaseous species in the plasma and subsequently control in a closed loop fashion the plasma through control of appropriate plasma parameters.

Yet still further, Frye et al., in U.S. Pat. No. 5,467,883 discloses an active neural network method and apparatus for controlling wafer attributes in plasma etch processes. The method and apparatus are largely similar with the preceding prior art, with the exception of the addition of an active neural network component. Finally, Hamerich et al., in U.S. Pat. No. 5,395,642 discloses a plasma deposition method for forming within integrated circuits conductor layers having high specific electrical conductivity. The electrical conductivity of the conductor layers is optimized employing an optical emission spectroscopy (OES) method to monitor the energy density of a plasma employed in forming the conductor layers.

Desirable in the art are additional methods through which reactive ion etch (RIE) plasmas employed in forming within integrated circuits patterned layers from blanket layers may be monitored and controlled such that the patterned layers may be formed with desired properties, such as, but not limited to: (1) blanket layer etch rate; and (2) patterned photoresist layer to blanket layer plasma etch selectivity. Particularly desirable are optical emission spectroscopy (OES) methods through which high density plasma (HDP) reactive ion etch (RIE) plasmas employed in forming within integrated circuits patterned layers from blanket layers may be monitored and controlled such that the patterned layers may be formed with desired properties, such as, but not limited to: (1) blanket layer etch rate; and (2) patterned photoresist layer to blanket layer plasma etch selectivity. It is towards these goals that the present invention is specifically directed.

SUMMARY OF THE INVENTION

A first object of the present invention is to provide a method for monitoring and controlling a reactive ion etch (RIE) plasma etch method employed in forming from a blanket layer a patterned layer to provide a reactive ion etch (RIE) plasma etch method with desired properties, such as, but not limited to: (1) blanket layer etch rate; and (2) patterned photoresist layer to blanket layer etch selectivity.

A second object of the present invention is to provide a method in accord with the first object of the present invention, where the reactive ion etch (RIE) plasma etch method is a high density plasma (HDP) reactive ion etch (RIE) plasma etch method.

A third object of the present invention is to provide a method in accord with the first object of the present invention or the second object of the present invention, where the blanket layer is a blanket dielectric layer and where the patterned layer is a patterned dielectric layer.

A fourth object of the present invention is to provide a method in accord with the first object of the present invention, the second object of the present invention and the third object of the present invention, which method is readily manufacturable.

In accord with the objects of the present invention, there is provided by the present invention a reactive ion etch (RIE) plasma etch method for forming upon a substrate a patterned layer from a blanket layer. To practice the method of the present invention, there is first provided a substrate having a blanket layer formed thereover. The blanket layer in turn has a patterned photoresist layer formed thereupon. There is then etched through a reactive ion etch (RIE) plasma etch method while employing the patterned photoresist layer as a patterned photoresist etch mask layer the blanket layer to form a patterned layer. The reactive ion etch (RIE) plasma etch method is monitored through an optical emission spectroscopy (OES) method which monitors a first plasma etchant component which relates to a chemical etching of the blanket layer and a second plasma etchant component which relates to a physical sputter etching of the blanket layer and the patterned photoresist layer. While etching the blanket layer through the reactive ion etch (RIE) plasma etch method there is adjusted at least one of a first control parameter which controls the first plasma etchant component concentration and a second control parameter which controls the second plasma etchant component concentration to provide through the reactive ion etch (RIE) plasma etch method from the blanket layer a patterned layer with a pre-determined blanket layer to patterned photoresist layer plasma etch selectivity.

The method of the present invention also contemplates a reactive ion etch (RIE) plasma etch apparatus through which the method of the present invention may be practiced.

The present invention provides a method for monitoring and controlling a reactive ion etch (RIE) plasma etch method employed in forming from a blanket layer a patterned layer to provide the reactive ion etch (RIE) plasma etch method with desired properties, such as, but not limited to: (1) blanket layer etch rate; and (2) patterned photoresist layer to blanket layer etch selectivity. The method of the present invention achieves this goal through employing an optical emission spectroscopy (OES) method which monitors a first plasma etchant component which relates to a chemical etching of the blanket layer and a second plasma etchant component which relates to a physical sputter etching of the blanket layer and the patterned photoresist layer. While etching the blanket layer through the reactive ion etch (RIE) plasma etch method there is then adjusted at least one of a first control parameter which controls the first plasma etchant component concentration and a second control parameter which controls the second plasma etchant component concentration to provide through the reactive ion etch (RIE) plasma etch method from the blanket layer a patterned layer with a pre-determined blanket layer to patterned photoresist layer plasma etch selectivity. Thus, through the present invention there is provided a method for monitoring and controlling a reactive ion etch (RIE) plasma etch method employed in forming from a blanket layer a patterned layer, where the reactive ion etch (RIE) plasma etch method has desired properties, such as, but not limited to: (1) blanket layer etch rate; and (2) patterned photoresist layer to blanket layer etch rate ratio.

The method of the present invention may be employed where the reactive ion etch (RIE) plasma is a high density plasma (HDP) reactive ion etch (RIE) plasma. The method of the present invention does not discriminate with respect to the nature of the reactive ion etch (RIE) plasma. Thus, although the method of the present invention is more likely to provide value when monitoring and controlling high density plasma (HDP) reactive ion etch (RIE) plasmas, the method of the present invention may also be employed in monitoring and controlling reactive ion etch (RIE) plasmas other than high density plasma (HDP) reactive ion etch (RIE) plasmas.

The method of the present invention may be employed where the blanket layer is a blanket dielectric layer and where the patterned layer is a patterned dielectric layer. The method of the present invention does not discriminate with respect to the nature of the blanket layer or the nature of the patterned layer provided that the blanket layer when being etched through a reactive ion etch (RIE) plasma etch method may be monitored through an optical emission spectroscopy (OES) method where there is monitored a first plasma etchant component which relates to a chemical etching of a blanket layer and a second plasma etchant component which relates to a physical sputter etching of etching the blanket layer and a patterned photoresist layer. Thus, the method of the present invention may be employed when the blanket layer is a blanket dielectric layer and when the patterned layer is a patterned dielectric layer.

The method of the present invention is readily manufacturable. The method of the present invention employs an optical emission spectroscopy (OES) method for monitoring within a reactive ion etch (RIE) plasma etch method a first plasma etchant component which relates to a chemical etching of a blanket layer and a second plasma etchant component which relates to a physical sputtering etching of the blanket layer and a patterned photoresist layer formed upon the blanket layer. There is then controlled through a minimum of one of a first control parameter which controls the first plasma etchant component concentration and a second control parameter which controls the second plasma etchant component concentration the etch selectivity ratio of the patterned photoresist layer to the blanket layer. Since optical emission spectroscopy (OES) methods are known in the art, and, as described within the Description of the Preferred Embodiment, a choice of first control parameter and second control parameter is accessible to a person skilled in the art, the method of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the contest of the accompanying drawings, which form a material part of this disclosure, wherein.

DESCRIPTION OF THE PREFERRED EMBODIMENT

The present invention provides a reactive ion etch (RIE) method for forming within an integrated circuit a series of patterned layers from a blanket layer, where the reactive ion etch (RIE) method has desired properties, such as, but not limited to: (1) blanket layer etch rate; and (2) patterned photoresist layer to blanket layer etch selectivity. The method of the present invention achieves this goal through employing within the reactive ion etch (RIE) method an optical emission spectroscopy (OES) method, where the optical emission spectroscopy (OES) method monitors a first plasma etchant component which relates to a chemical etching of the blanket layer and a second plasma etchant component which relates to a physical sputter etching of the blanket layer and a patterned photoresist etch mask layer formed upon the blanket layer. By controlling within the reactive ion etch (RIE) plasma etch method at least one of a first control parameter which controls the first plasma etchant component concentration and a second control parameter which controls the second plasma etchant component concentration, there may be formed through the reactive ion etch (RIE) plasma etch method a patterned layer through a reactive ion etch (RIE) plasma etch method exhibiting desired properties such as, but not limited to: (1) blanket layer etch rate; and (2) patterned photoresist layer to blanket layer etch selectivity.

As is illustrated in the description which follows, the method of the present invention may be employed in forming within an integrated circuit a patterned silicon oxide dielectric layer from a blanket silicon oxide dielectric layer, where: (1) the blanket silicon oxide dielectric layer is a blanket silicon oxide pre-metal dielectric (PMD) layer most closely adjoining a semiconductor substrate within the integrated circuit; or (2) where the blanket silicon oxide dielectric layer is a blanket silicon oxide inter-metal dielectric (PMD) layer formed further removed from the semiconductor substrate within the integrated circuit. More generally, the method of the present invention may be employed in forming upon substrates patterned layers from blanket layers where the blanket layers are formed from materials including but not limited to dielectric materials, semiconductor materials and conductor materials. Typically and preferably, the blanket layer will have a thickness of from about 5000 to about 20000 angstroms. Similarly, the substrates may in general be dielectric substrates, semiconductor substrates or conductor substrates.

In addition, the method of the present invention may in general be employed in forming patterned layers from blanket layers within integrated circuits including but not limited to dynamic random access memory (DRAM) integrated circuits, static random access memory (SRAM) integrated circuits, application specific integrated circuits (ASICs), integrated circuits having within their fabrication field effect transistors (FETs), integrated circuits having within their fabrication bipolar transistors and integrated circuits having within their fabrications bipolar complementary metal oxide semiconductor (BiCMOS) transistors.

Figure 3:
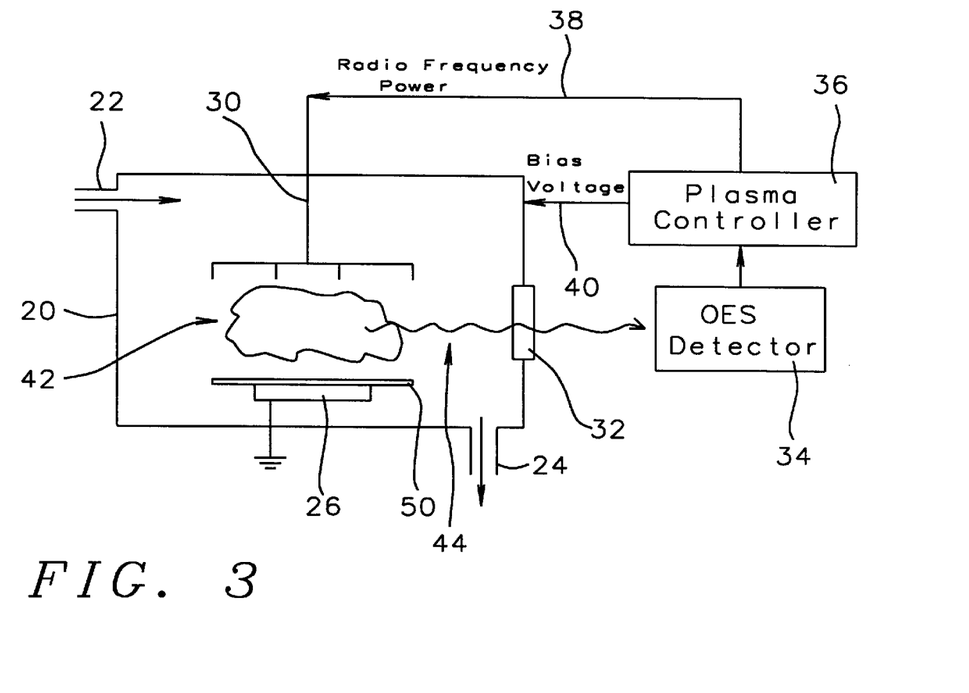
FIG. 3 shows a schematic cross-sectional diagram of a high density plasma (HDP) reactive ion etch (RIE) plasma reactor chamber in accord with the preferred embodiment of the present invention.

Referring now to FIG. 3, there is shown a schematic cross-sectional diagram of a high density plasma (HDP) reactive ion etch (RIE) plasma etch reactor chamber employed in accord with the preferred embodiment of the method of the present invention. Shown in FIG. 3 is a reactor chamber 20 having therein a platen 26 upon which is placed a semiconductor substrate 50. The semiconductor substrate 50 has formed thereupon a blanket silicon oxide dielectric layer (not shown) which is desired to be patterned into a patterned silicon oxide dielectric layer. The reactor chamber 20 is accessed through an inlet port 22 through which an etchant gas composition is introduced into the reactor chamber 20 when etching through the high density plasma (HDP)

reactive ion etch (RIE) plasma etch method the blanket silicon oxide dielectric layer formed upon the semiconductor substrate 50. Reacted and unreacted etchant gas, and high density plasma (HDP) reactive ion etch (RIE) reaction products are exhausted from the reactor chamber 20 by means of a pump (not shown) communicating with an outlet port 24.

Also shown in FIG. 3 is a radio frequency electrode 30 through which a radio frequency power is introduced into the reactor chamber 20 to form within the reactor chamber 20 a high density plasma (HDP) reactive ion etch (RIE) plasma 42. Also shown in FIG. 3 is a window 32 through which an emitted light beam 44 emitted from the high density plasma (HDP) reactive ion etch (RIE) plasma 42 may be observed and monitored. In proximity with the window 32 is an optical emission spectroscopy (OES) detector 34. The optical emission spectroscopy (OES) detector 34 is typically comprised of a spectrophotometer, photodiode array or other suitable means which provides for determining the location and relative intensity of a spectrum of wavelengths of light within the emitted light beam 44 issuing from the high density plasma (HDP) reactive ion etch (RIE) plasma 42. As is shown in FIG. 3, an output from the optical emission spectroscopy (OES) detector 34 is fed to a plasma controller 36 which controls several of the parameters under which is formed the high density plasma (HDP) reactive ion etch (RIE) plasma 42 within the reactor chamber 20. Finally, there is shown in FIG. 3 connected to the plasma controller 36: (1) a first feedback control loop 38 which controls the radio frequency power to the radio frequency electrode 30; and (2) a second feedback control loop 40 which controls the bias voltage between the reactor chamber 20 and the semiconductor substrate 50 upon the platen 26. Although not specifically illustrated in FIG. 3, several other parameters typically also influence the properties of the high density plasma (HDP) reactive ion etch (RIE) plasma 42, including but not limited to reactor chamber 20 pressure and etchant gas compositions/flow rates. These other parameters may also be controlled through additional feedback control loops connected to the plasma controller 36.

With respect to the preferred embodiment of the method of the present invention, and in particular to the blanket silicon oxide dielectric layer formed upon the semiconductor substrate 50 which is desired to be patterned through the method of the present invention, it is known in the art that silicon oxide dielectric layers may be etched within plasma etch methods, such as high density plasma (HDP) reactive ion etch (RIE) plasma etch methods, with any of several etchant gas compositions, including but not limited to carbon tetrafluoride ($CH_4$) etchant gas compositions, trifluoromethane ($CHF_3$) etchant gas compositions, hexafluoroethane ($C_2F_6$) etchant gas compositions, and mixtures of the foregoing etchant gas compositions with or without diluent gases. Thus, any of several etchant gas compositions may be employed within the method of the present invention when forming a patterned silicon oxide dielectric layer from the blanket silicon oxide dielectric layer formed upon the semiconductor substrate 50. Similarly, within the general method of the present invention, there is typically also a choice of several alternative etchant gas compositions which may be employed when it is desired to form patterned layers other than patterned silicon oxide layers from blanket layers other than blanket silicon oxide layers. Nonetheless, within the preferred embodiment of the method of the present invention the high density plasma (HDP) reactive ion etch (RIE) plasma 42 is preferably formed employing hexafluoroethane as an etchant gas.

Figure 4:
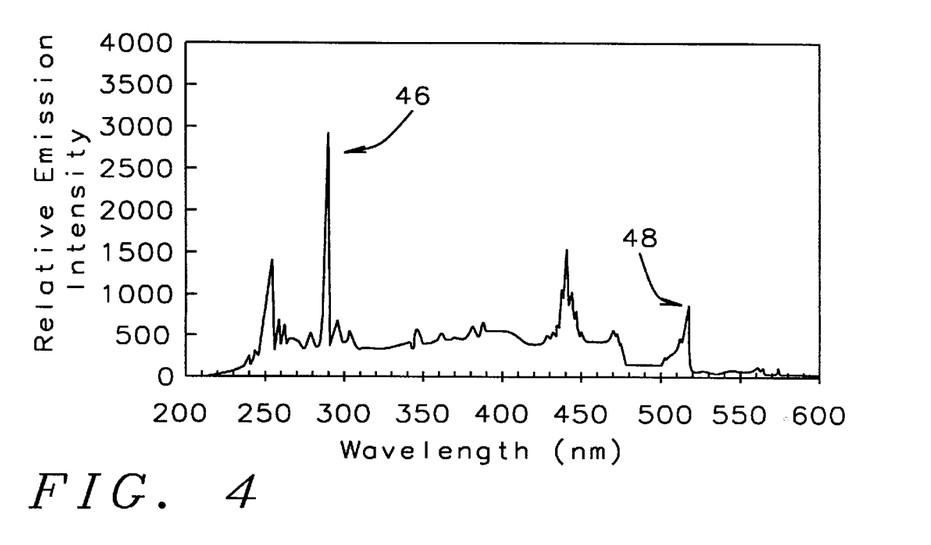
FIG. 4 shows an optical emission spectrum (OES) for a silicon oxide dielectric layer etched within a high density plasma (HDP) reactive ion etch (RIE) plasma employing a hexafluoroethane (C2F6) etchant in accord with the preferred embodiment of the method of the present invention.

Referring now to FIG. 4, there is shown an optical emission spectrum (OES) of the high density plasma (HDP) reactive ion etch (RIE) plasma 42 formed from the hexafluoroethane ($C_2F_6$) etchant gas composition in accord with the preferred embodiment of the method of the present invention and employed in etching the blanket silicon oxide dielectric layer formed upon the semiconductor substrate 50. In order to obtain the optical emission spectrum (OES) as illustrated in FIG. 4, the high density plasma (HDP) reactive ion etch (RIE) plasma 42 employing the hexafluoroethane ($C_2F_6$) etchant gas composition is employed at: (1) a reactor chamber pressure of from about 1 to about 50 mtorr; (2) a substrate temperature of about 50 to about 150 degrees centigrade; (3) a chamber roof temperature and a chamber wall temperature of from about 200 to about 300 degrees centigrade each; and (4) a hexafluoroethane ($C_2F_6$) flow rate of from about 20 to about 60 standard cubic centimeters per minute (sccm). Prominent within FIG. 4 is a first peak 46 at about 287.7 nanometers wavelength which corresponds with optical emission from silicon (Si) and a second peak 48 at about 516.9 nanometers wavelength which corresponds with optical emission from dicarbon ($C_2$). It has been determined experimentally for the preferred embodiment of the method of the present invention that the optical emission from dicarbon ($C_2$) is a sensitive measure of a first plasma etchant component which relates to chemical etching of the blanket silicon oxide dielectric layer formed upon the semiconductor substrate 50, while it has similarly been determined experimentally for the preferred embodiment of the method of the present invention that the optical emission from silicon (Si) is a sensitive measure of a second plasma etchant component which relates to a physical sputter etching of the blanket silicon oxide dielectric layer formed upon the semiconductor substrate 50 and a patterned photoresist layer formed upon the blanket silicon oxide dielectric layer. When employing through the general method of the present invention a reactive ion etch (RIE) plasma other than the high density plasma (HDP) reactive ion etch (RIE) plasma 42 which preferably employs a hexafluoroethane ($C_2F_6$) etchant gas composition to form from a blanket silicon oxide dielectric layer a patterned silicon oxide dielectric layer, there may independently be determined and monitored other plasma etchant components which relate to either a chemical etching of a blanket layer or a physical sputter etching of the blanket layer and a patterned photoresist layer formed upon the blanket layer.

Finally, within the preferred embodiment of the method of the present invention it has also been determined experimentally that: (1) the relative intensity (and relative concentration) of dicarbon ($C_2$) first plasma etchant component may be controlled by controlling the radio frequency power within the reactor chamber 20 through the first feedback control loop 38; and (2) the relative intensity (and relative concentration) of silicon (Si) second plasma etchant component may be controlled by controlling the bias voltage through the second feedback control loop 40. Within the context of the preferred embodiment of the method of the present invention, it is preferred to adjust at least one of the radio frequency power through the first feedback control loop 38 and the bias voltage through the second feedback control loop 40 to maintain a relative intensity ratio of the dicarbon ($C_2$) peak at about 516.9 nanometers to the silicon (Si) peak at about 287.8 nanometers at about 0.3:1 to about 1.2:1. More preferably, the relative intensity ratio of the dicarbon ($C_2$) peak at about 516.9 nanometers to the silicon (Si) peak at about 287.8 nanometers is maintained at about 0.5:1 to about 1.0:1. To achieve the foregoing relative intensity ratios of the dicarbon (C2) peak at about 516.9 nanometers with respect to the silicon (Si) peak at about 287.8 nanometers, typically, although not exclusively, the radio frequency power will be in a range of from about 2100 to about 3000 watts at a radio frequency of 2.0 MHZ and the bias voltage will be in a range of from about 200 to about 300 volts (corresponding with a bias power of from about 1100 to about 1400 watts). Under circumstances where the relative intensity ratio of the dicarbon (C2) peak at about 516.9 nanometers to the silicon (Si) peak at about 287.8 nanometers is maintained within the foregoing preferred range, there is provided a high density plasma (HDP) reactive ion etch (RIE) plasma etch method with desired properties, such as, but not limited to: (1) blanket silicon oxide dielectric layer etch rate; and (2) patterned photoresist layer to blanket silicon oxide dielectric layer selectivity.

Figure 5:
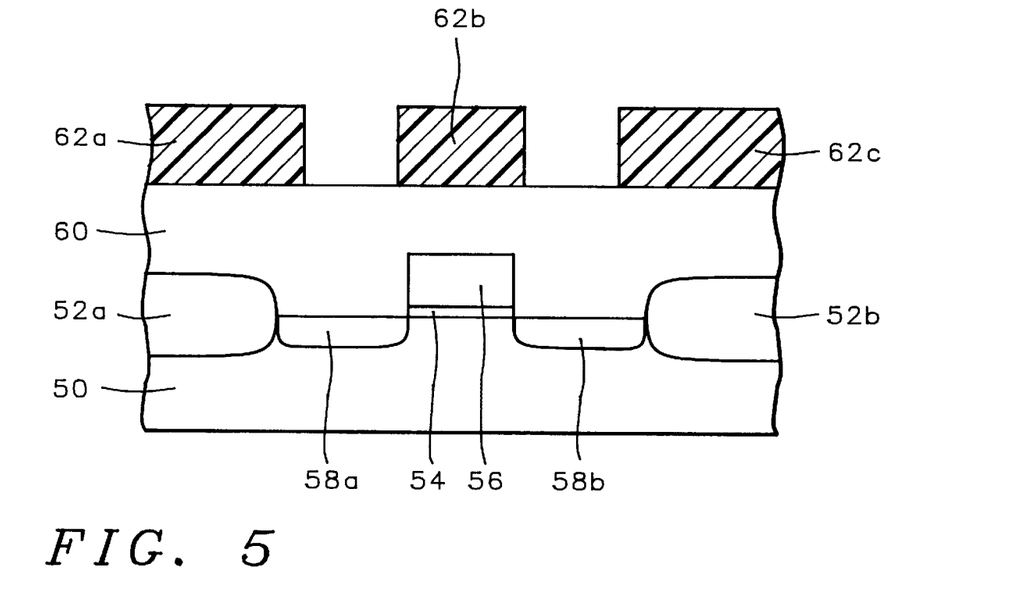
FIG. 5 to FIG. 8 show a series of schematic cross-sectional diagrams illustrating the results of progressive stages in forming within an integrated circuit two series of patterned silicon oxide dielectric layers employing two successive high density plasma (HDP) reactive ion etch (RIE) plasma etch methods in accord with the preferred embodiment of the method of the present invention.

Referring now to FIG. 5 to FIG. 8, there is shown a series of schematic cross-sectional diagrams illustrating the results of progressive stages in forming within an integrated circuit two series of patterned silicon oxide dielectric layers through the preferred embodiment of the method of the present invention. Shown in FIG. 5 is a schematic cross-sectional diagram of the integrated circuit at an early stage in its fabrication.

Shown in FIG. 5 is the semiconductor substrate 50 having formed within and upon its surface a pair of isolation regions 52a and 52b which define an active region of the semiconductor substrate 50. Although semiconductor substrates are known in the art with either dopant polarity, various dopant concentrations and several crystallographic orientations, for the preferred embodiment of the method of the present invention, the semiconductor substrate 50 is preferably a (100) silicon semiconductor substrate having an N- or P-doping. Similarly, although it is also known in the art that isolation regions may be formed within and/or upon semiconductor substrates through methods including but not limited to isolation region thermal growth methods and isolation region deposition/patterning methods, for the preferred embodiment of the method of the present invention the isolation regions 52a and 52b are preferably formed through an isolation region thermal growth method at a temperature of from about 960 to about 1000 degrees centigrade to form isolation regions 52a and 52b of silicon oxide within and upon the semiconductor substrate 50.

Also shown within FIG. 5, within or upon the active region of the semiconductor substrate 50, is a series of structures which comprises a field effect transistor (FET). The structures include: (1) a gate dielectric layer 54; (2) a gate electrode 56; and (3) a pair of source/drain regions 58a and 58b. The gate dielectric layer 54, the gate electrode 56 and the pair of source/drain regions 58a and 58b may be formed through methods as are conventional in the art of field effect transistor (FET) fabrication. Typically and preferably, the gate dielectric layer 54 is formed of a silicon oxide dielectric material formed to a thickness of from about 60 to about 80 angstroms upon the active region of the semiconductor substrate 50. Similarly, the gate electrode 56 is typically and preferably formed of a polysilicon or polycide gate electrode material formed and aligned upon the gate dielectric layer 54 at a thickness of from about 2000 to about 3000 angstroms. Finally, the source/drain regions 58a and 58b are typically and preferably formed into the active region of the semiconductor substrate 50 employing the gate dielectric layer 54 and the gate electrode 56 as a mask while employing a suitable dopant at an ion implantation dose of from about 1E15 to about 5E16 ions per square centimeter and an ion implantation energy of from about 15 to about 50 keV.

Also shown in FIG. 5 is a planarized pre-metal dielectric (PMD) layer 60 which is the first of two planarized dielectric layers desired to be patterned through the preferred embodiment of the method of the present invention. Although other methods and materials may be employed in forming the planarized pre-metal dielectric (PMD) layer 60, the planarized pre-metal dielectric (PMD) layer 60 is preferably formed from a silicon oxide material deposited through a plasma enhanced chemical vapor deposition (PECVD) method and planarized through a chemical mechanical polish (CMP) planarizing method, as is conventional in the art of integrated circuit fabrication. Preferably, the planarized pre-metal dielectric (PMD) layer 60 is from about 7000 to about 11000 angstroms thick.

Finally, there is shown in FIG. 5 the presence of a series of patterned first photoresist layers 62a, 62b and 62c which serve as a series of patterned photoresist etch mask layers. While the patterned first photoresist layers 62a, 62b and 62c may be formed from any of several photoresist materials chosen from the general classes of photoresist materials including but not limited to positive photoresist materials and negative photoresist materials, the patterned first photoresist layers 62a, 62b and 62c are preferably formed of a positive novolak photoresist material or a positive poly-methyl-meth-acrylate (PMMA) photoresist material, since such photoresist materials are typically employed in forming patterned photoresist layers with the limited linewidths and aperture widths needed within advanced integrated circuits. However, other types of photoresist materials, such as but not limited to other i-line (ie: 365 nanometer (nm)) and deep ultra-violet (DUV) (ie: 248 nanometer (nm)) photoresist materials may also be employed within the method and apparatus of the present invention to yield similar, albeit not necessarily duplicate, results through the method and apparatus of the present invention.

Figure 6:
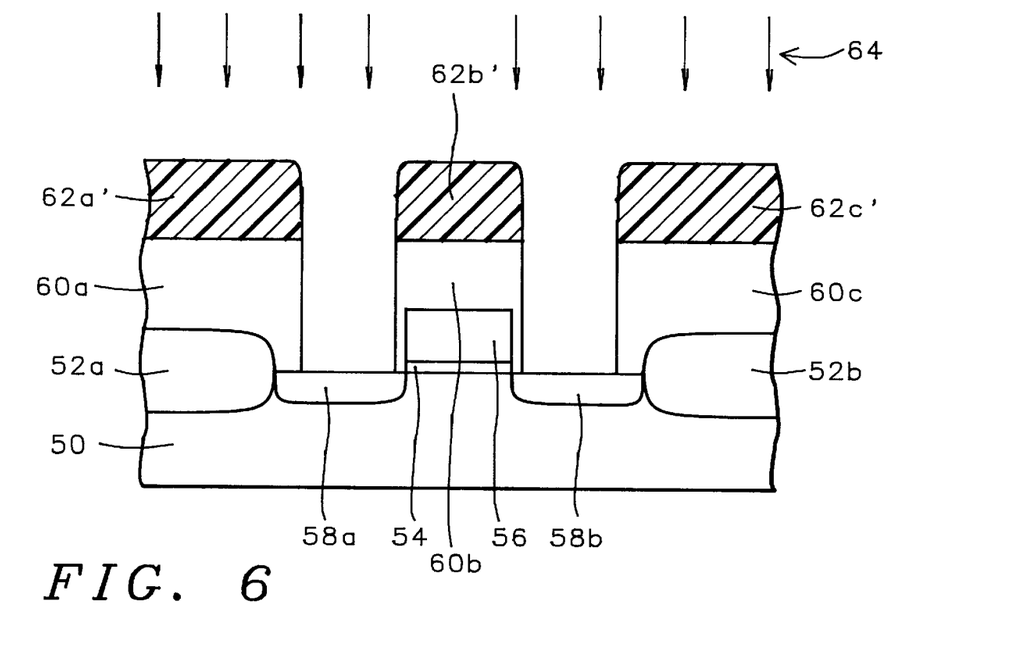

Referring now to FIG. 6, there is shown a schematic cross-sectional diagram illustrating the results of further processing of the integrated circuit whose schematic cross-sectional diagram is illustrated in FIG. 5. Shown in FIG. 6 is the results of etching through a first high density plasma (HDP) reactive ion etch (RIE) plasma 64, while employing the patterned first photoresist layers 62a, 62b and 62c as photoresist etch mask layers, the planarized pre-metal dielectric layer 60 to form the patterned planarized pre-metal dielectric (PMD) layers 60a, 60b and 60c. The first high density plasma (HDP) reactive ion etch (RIE) plasma 64 is formed through methods and materials disclosed above for the high density plasma (HDP) reactive ion etch (RIE) plasma 42. Thus, when employing the first high density plasma (HDP) reactive ion etch (RIE) plasma 64, the patterned planarized pre-metal dielectric (PMD) layers 60a,60b and 60c are formed with improved etch rate and with improved etch selectivity with respect to the a series of etched patterned first photoresist layers 62a', 62b' and 62c' formed from the patterned first photoresist layers 62a, 62b and 62c.

Figure 7:
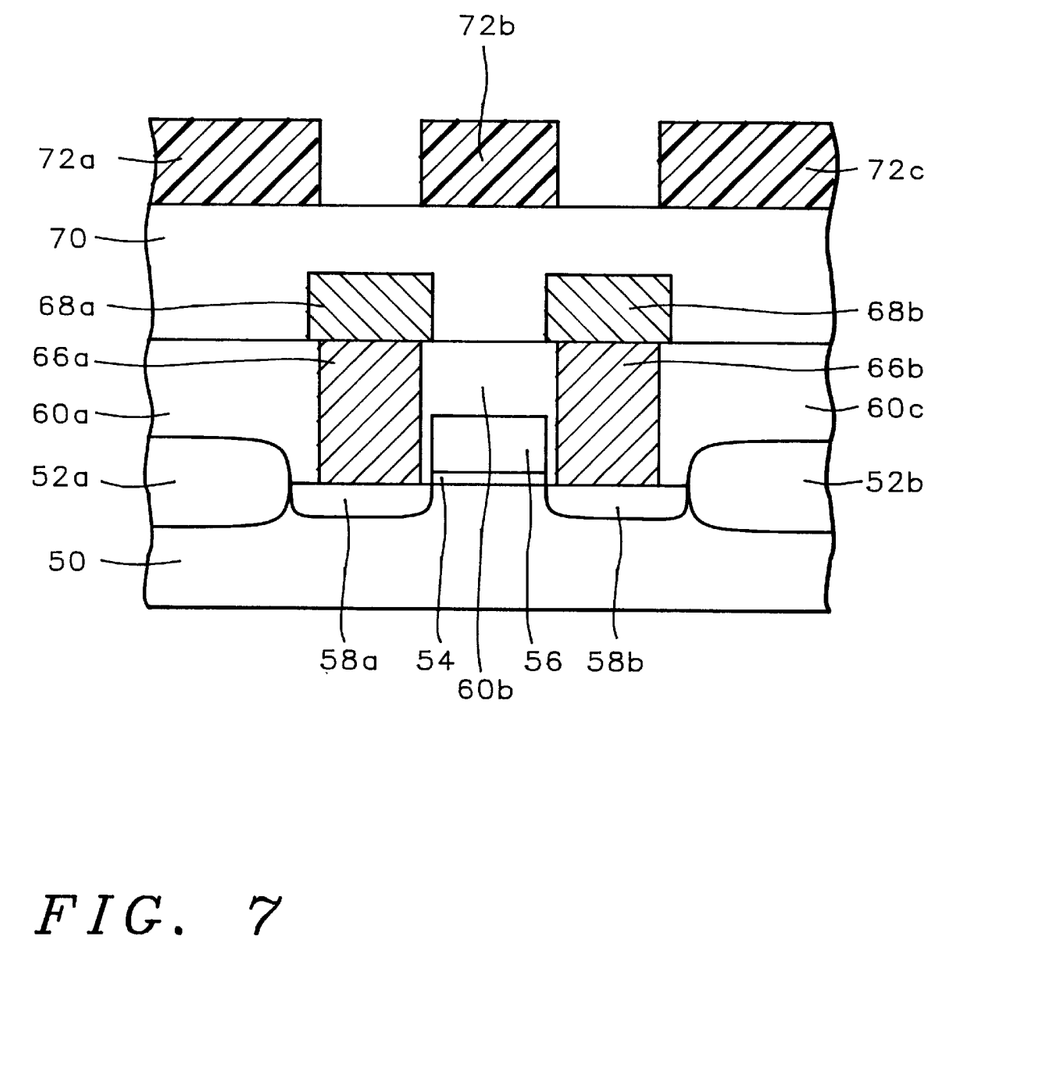

Referring now to FIG. 7, there is shown a schematic cross-sectional diagram illustrating the results of further processing of the integrated circuit whose schematic cross-sectional diagram is illustrated in FIG. 6. Shown in FIG. 7 is a schematic cross-sectional diagram of an integrated circuit otherwise equivalent to the integrated circuit whose schematic cross-sectional diagram is illustrated in FIG. 6, but from whose surface has been removed the etched patterned first photoresist layers 62a', 62b' and 62c'. The etched patterned first photoresist layers 62a', 62b' and 62c' may be removed through methods as are conventional in the art, which will typically include, but are not limited to, wet chemical stripping methods and dry plasma stripping methods. There is then formed into the pair of apertures between the patterned planarized pre-metal dielectric (PMD) layers 60a, 60b and 60c a pair of conductive contact studs 66a and 66b which in turn has formed and aligned thereupon a corresponding pair of patterned first conductor layers 68a and 68b. The pair of conductive contact studs 66a and 66b, and the pair of patterned first conductor layers 68a and 68b may be formed through methods as are conventional in the art of integrated circuit fabrication. Typically and preferably, the pair of conductive contact studs 66a and 66b is formed at least in part of tungsten, of a thickness sufficient to completely fill the apertures defined by the patterned planarized pre-metal dielectric layers 60a, 60b and 60c. Typically and preferably, the pair of patterned first conductor layers 68a and 68b is formed at least in part of an aluminum containing conductor material. Typically and preferably, the patterned first conductor layers 68a and 68b are formed to a thickness of from about 4000 to about 6600 angstroms.

Also shown in FIG. 7 is a planarized inter-metal dielectric (IMD) layer 70 formed upon the patterned planarized pre-metal dielectric (PMD) layers 60a, 60b and 60c, and the pair of patterned first conductor layers 68a and 68b. The planarized inter-metal dielectric (IMD) layer 70 is preferably formed through methods, materials and dimensions analogous or equivalent to the methods, materials and dimensions employed in forming the planarized pre-metal dielectric (PMD) layer 60. Finally, there is shown in FIG. 7 a series of patterned second photoresist layers 72a, 72b and 72c. Similarly, the series of patterned second photoresist layers 72a, 72b and 72c is preferably formed through methods, materials and dimensions analogous or equivalent to the methods, materials and dimensions employed in forming the patterned first photoresist layers 62a, 62b and 62c.

Figure 8:
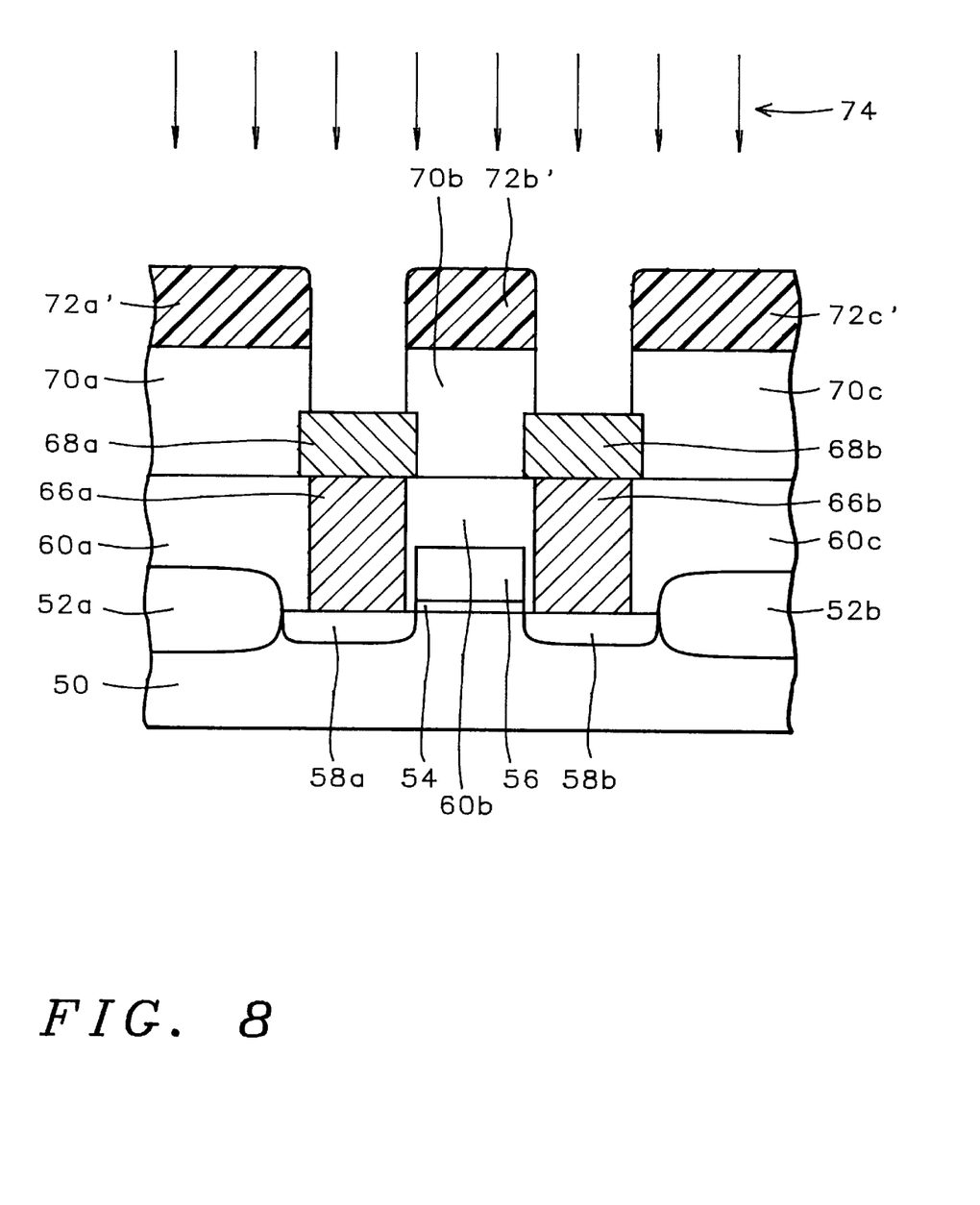

Referring now to FIG. 8, there is shown a schematic cross-sectional diagram illustrating the results of further processing of the integrated circuit whose schematic cross-sectional diagram is illustrated in FIG. 7. Shown in FIG. 8 is the results of patterning through a second high density plasma (HDP) reactive ion etch (RIE) plasma 74, while employing the series of patterned second photoresist layers 72a, 72b and 72c as a photoresist etch mask layer, the planarized inter-metal dielectric (IMD) layer 70 to form the patterned planarized inter-metal dielectric layers 70a, 70b and 70c. Preferably, the second high density plasma (HDP) reactive ion etch (RIE) plasma 74 is formed employing methods and materials equivalent to the methods and materials employed in forming the first high density plasma (HDP) reactive ion etch (RIE) plasma 64. Thus, the series of patterned planarized inter-metal dielectric (IMD) layers 70a, 70b and 70c is formed with improved etch rate and with improved etch selectivity with respect to the series of etched patterned second photoresist layers 72a', 72b' and 72c' which are formed from the patterned second photoresist layers 72a, 72b and 72c.

EXAMPLES

Upon each semiconductor substrate within a pair of (100) silicon semiconductor substrates was formed a silicon oxide dielectric layer through a plasma enhanced chemical vapor deposition (PECVD) method employing silane as a silicon source material. The silicon oxide dielectric layers were formed at: (1) a reactor chamber pressure of about 5 torr; (2) a radio frequency power of about 250 watts; (3) a substrate temperature of about 400 degrees centigrade; and (3) a silane flow rate of about 115 standard cubic centimeters per minute (sccm). The thicknesses of the two silicon oxide dielectric layers were about 8000 angstroms each.

Upon each of the silicon oxide dielectric layers was then formed a patterned photoresist layer formed of a positive photoresist material available from Sumitomo Chemical Co. as PFI-38A8 photoresist material. Each of the two patterned photoresist layers had linewidth dimensions of about 0.4 microns, pitch dimensions of about 0.8 microns and a thickness of about 8000 angstroms providing an uneven topography with upper lying photoresist plateaus and lower lying photoresist facets.

The silicon oxide dielectric layer formed upon one of the two semiconductor substrates was then etched through a high density plasma (HDP) reactive ion etch (RIE) plasma in accord with the preferred embodiment of the method of the present invention, where there was monitored through an optical emission spectroscopy (OES) method a relative intensity of a dicarbon (C2) first plasma etchant component at about 516.9 nanometers and a silicon (Si) second plasma etchant component at about 287.8 nanometers. The relative intensity of the dicarbon (C2) first plasma etchant component with respect to the silicon (Si) second plasma etchant component was maintained at a ratio of about 0.8:1 through feedback control of a bias voltage. The high density plasma (HDP) plasma reactive ion etch (RIE) plasma etch method additionally employed: (1) a reactor chamber pressure of about 5 mtorr; (2) a radio frequency power of about 2800 watts at a radio frequency of 2.0 MHZ; (3) a substrate temperature of about 120 degrees centigrade; (4) a reactor chamber roof temperature of about 260 degrees centigrade; (5) a reactor chamber wall temperature of about 220 degrees centigrade; (6) a bias power of about 1400 watts; and (7) a hexafluoroethane (C2F6) flow rate of about 40 standard cubic centimeters per minute (sccm), for a time sufficient to completely etch the silicon oxide dielectric layer.

The silicon oxide dielectric layer formed upon the second semiconductor substrate was etched through a high density plasma (HDP) reactive ion etch (RIE) plasma otherwise equivalent to the high density plasma (HDP) reactive ion etch (RIE) plasma employed in etching the silicon oxide dielectric layer formed upon the first semiconductor substrate, with the exception that there was not employed an optical emission spectroscopy (OES) method for monitoring and controlling the high density plasma (HDP) reactive ion etch (RIE) plasma etch method.

After there was etched each of the two silicon oxide dielectric layers there was determined for each of the two silicon oxide dielectric layers: (1) the silicon oxide dielectric layer etch rate; (2) the etch uniformity; (3) the silicon oxide dielectric layer to patterned photoresist layer etch selectivity at higher plateaus; and (4) the silicon oxide dielectric layer to patterned photoresist layer etch selectivity at lower facets. Results of the measurements and determinations are reported in Table I.

TABLE I

| Etch Parameter | HDP-RIE/no OES | HDP-RIE/with OES |
|---|---|---|
| Etch Rate (A/min) | 7087 | 8344 |
| Uniformity (%) | 4.9 | 3.6 |
| Oxide/PR Selectivity | | |
| over high plateau | 3.24 | 4.61 |
| over low facet | 1.50 | 2.32 |

From review of the data presented in Table I, it is seen that a high density plasma (HDP) reactive ion etch (RIE) plasma monitored through an optical emission spectroscopy (OES) method and controlled in accord with the preferred embodiment of the method of the present invention provides patterned silicon oxide dielectric layers with desired properties, such as, but not limited to: (1) improved etch rate; (2) improved uniformity; and (3) improved blanket silicon oxide dielectric layer to patterned photoresist layer etch selectivity.

As is understood by a person skilled in the art, the preferred embodiment and examples of the present invention are illustrative of the present invention rather than limiting of the present invention. Revisions and modifications may be made to methods, materials, structures and dimensions through which are provided the preferred embodiment and examples of the present invention while still providing embodiments and examples which are within the spirit and scope of the present invention, as defined by the appended claims.

What is claimed is:

1. A method for monitoring and controlling a plasma etch method for forming a patterned layer comprising:

providing a substrate, the substrate having a blanket layer formed thereover, the blanket layer having a patterned photoresist layer formed thereupon;

etching, through a plasma etch method while employing the patterned photoresist layer as a patterned photoresist etch mask layer, the blanket layer to form a patterned layer, the plasma etch method being monitored through an optical emission spectroscopy (OES) method which monitors a minimum of a first plasma etchant component which relates to a chemical etching of the blanket layer and a second plasma etchant component which relates to a physical sputter etching of the blanket layer and the patterned photoresist layer; and adjusting while etching through the plasma etch method, at least one of a first control parameter which controls the first plasma etchant component concentration and a second control parameter which controls the second plasma etchant component concentration to provide through the plasma etch method from the blanket layer a patterned layer with a pre-determined blanket layer to patterned photoresist layer plasma etch selectivity.

2. The method of claim 1 wherein the substrate is chosen from a group of substrates consisting of dielectric substrates, semiconductor substrates and conductor substrates.

3. The method of claim 1 wherein the blanket layer is chosen from a group of blanket layers consisting of blanket dielectric layers, blanket semiconductor layers and blanket conductor layers.

4. The method of claim 1 wherein the plasma etch method is a high density plasma (HDP) reactive ion etch (RIE) plasma etch method.

5. A method for monitoring and controlling a plasma etch method for forming a patterned dielectric layer comprising:

providing a substrate, the substrate having a blanket dielectric layer formed thereover, the blanket dielectric layer having a patterned photoresist layer formed thereupon;

etching, through a plasma etch method while employing the patterned photoresist layer as a patterned photoresist etch mask layer, the blanket dielectric layer to form a patterned dielectric layer, the plasma etch method being monitored through an optical emission spectroscopy (OES) method which monitors a minimum of a first plasma etchant component which relates to a chemical etching of the blanket dielectric layer and a second plasma etchant component which relates to a physical sputter etching of the blanket dielectric layer and the patterned photoresist layer; and adjusting, while etching through the plasma etch method, at least one of a first control parameter which controls the first plasma etchant component concentration and a second control parameter which controls the second plasma etchant component concentration to provide through the plasma etch method from the blanket dielectric layer a patterned dielectric layer with a pre-determined blanket dielectric layer to patterned photoresist layer plasma etch selectivity.

6. The method of claim 5 wherein the blanket dielectric layer is a blanket silicon oxide dielectric layer.

7. The method of claim 6 wherein the plasma etch method is a high density plasma (HDP) reactive ion etch (RIE) plasma etch method.

8. The method of claim 7 wherein:

the first plasma etchant component is dicarbon (C2) derived from a hexafluoroethane (C2F6) plasma etchant gas; and the first control parameter is a radio frequency power employed within the plasma etch method.

9. The method of claim 8 wherein:

the second plasma etchant component is silicon (Si) derived from physical sputter etching of the blanket dielectric layer; and the second control parameter is a bias voltage employed within the plasma etch method.

10. The method of claim 9 wherein at least one of the first control parameter and the second control parameter is adjusted to provide an optical emission spectrum (OES) relative intensity ratio of dicarbon (C2) emission at about 516.9 nanometers wavelength to silicon (Si) emission at about 287.8 nanometers wavelength of from about 0.3:1 to about 1.2:1.

* * * * *